United States Patent
Chung et al.

(10) Patent No.: US 7,510,934 B2
(45) Date of Patent: Mar. 31, 2009

(54) METHODS OF FABRICATING NONVOLATILE MEMORY DEVICES

(75) Inventors: Seung-Pil Chung, Seoul (KR); Jong-Ho Park, Seoul (KR); Kyeong-Koo Chi, Seoul (KR); Dong-Hyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 11/807,544

(22) Filed: May 29, 2007

(65) Prior Publication Data

US 2007/0231989 A1    Oct. 4, 2007

Related U.S. Application Data

(62) Division of application No. 11/190,314, filed on Jul. 26, 2005, now Pat. No. 7,242,054.

(30) Foreign Application Priority Data

Aug. 4, 2004    (KR) ............... 10-2004-0061472

(51) Int. Cl.
*H01L 21/336* (2006.01)
(52) U.S. Cl. ............. 438/259; 438/257; 438/266; 438/424; 257/E21.422
(58) Field of Classification Search ............ 438/424, 438/257, 266, 259; 257/E21.422
See application file for complete search history.

(56) References Cited

U.S. PATENT DOCUMENTS 6,034,393 A * 3/2000 Sakamoto et al. ......... 257/315
6,656,793 B2  12/2003 Jeong et al. ............. 438/257
6,969,884 B2 * 11/2005 Kitamura et al. ......... 257/315
7,034,355 B2 * 4/2006 Miki ..................... 257/314

FOREIGN PATENT DOCUMENTS

| JP | 2004-022819 | 1/2004 |
| KR | 1020030048957 | 6/2003 |
| KR | 1020040001986 | 1/2004 |

* cited by examiner

*Primary Examiner*—Victor A Mandala
(74) *Attorney, Agent, or Firm*—Myers Bigel Sibley & Sajovec, P.A.

(57) ABSTRACT

A nonvolatile memory device includes a semiconductor substrate, a device isolation film, a tunnel insulation film, a plurality of floating gates, an inter-gate dielectric film, and a control gate pattern. Trenches are formed in the substrate that define active regions therebetween. The device isolation film is in the trenches in the substrate. The tunnel insulation film is on the active regions of the substrate. The plurality of floating gates are each on the tunnel insulation film over the active regions of the substrate. The inter-gate dielectric film extends across the floating gates and the device isolation film. The control gate pattern is on the inter-gate dielectric film and extends across the floating gates. A central region of the device isolation film in the trenches has an upper major surface that is recessed below an upper major surface of a surrounding region of the device isolation film in the trenches. An edge of the recessed central region of the device isolation film is aligned with a sidewall of an adjacent one of the floating gates.

15 Claims, 5 Drawing Sheets

METHODS OF FABRICATING NONVOLATILE MEMORY DEVICES

CROSS-REFERENCE TO RELATED APPLICATIONS

This application is a divisional of U.S. patent application Ser. No. 11/190,314, filed Jul. 26, 2005, which is now U.S. Pat. No. 7,242,054, and claims priority under 35 U.S.C. § 119 to Korean Patent Application No. 10-2004-0061472 filed on Aug. 4, 2004, in the Korean Intellectual Property Office, the disclosures of which are herein incorporated by reference in their entirety.

FIELD OF THE INVENTION

The present invention relates to nonvolatile memory device technology and, more particularly, to floating gate non-volatile memory devices and methods of fabricating the same.

BACKGROUND OF THE INVENTION

The integration density and storage capacity of nonvolatile memory devices have been increased by decreasing the size of active regions and isolation films within cell array regions of the devices. One approach for fabricating such devices uses a self-aligned polysilicon fabrication process. The circuit area of a memory device may be reduced using the self-aligned polysilicon fabrication process by forming a floating gate pattern on an area that is confined between adjacent device isolation films.

U.S. Pat. No. 6,656,793, entitled "Method of forming a self aligned floating gate in flash memory cell", discloses a process for enlarging a surface area of a floating gate pattern through a self-aligned polysilicon fabrication process. After forming the floating gate pattern on a region that is defined between adjacent device isolation film, the device isolation film is partially removed through an isotropic etching process to expose sidewalls of the floating gate pattern.

FIG. 1 is a cross sectional view of a conventional nonvolatile memory device. Referring to FIG. 1, a semiconductor substrate 50 is grooved to form trenches with active regions 59 therebetween, and a device isolation film 58 is formed in the trenches. A tunnel insulation film (60 in FIGS. 3 and 4) is formed on the active regions 59 of the substrate 50. Floating gates 62 are formed on the tunnel insulation film (60 in FIGS. 3 and 4) over the active regions 59 of the substrate 50.

An inter-gate dielectric film 64 is formed on the floating gates 62 and the device isolation film. A control gate pattern 66 is deposited on the inter-gate dielectric film 64 over the floating gates 62. An upper surface of the device isolation film 58 is lower than an upper surface of the floating gates 62, and the interlevel dielectric film 64 covers a portion of sidewalls of the floating gates 62. The floating gates 62 are wider than the substrate 50 between the trenches, so that they partially overlap the trenches. Forming the control gate pattern 66 on sidewalls of the floating gates 62 and overlapping the floating gates 62 with a portion of the trenches can increase the capacitive coupling between the control gate pattern 66 and the floating gates 62.

FIGS. 2, 3, and 4 are cross sectional views of conventional nonvolatile memory devices and illustrate methods of fabricating the same.

Referring to FIG. 2, the substrate 50 is etched to form the plurality of trenches. The device isolation film 58 is deposited to fill the trenches. After its deposition, the device isolation film 58 includes projections that extend away from the substrate 50.

Referring to FIG. 3, the device isolation film 58 is recessed by an isotropic etching process so that its upper surface is below an upper surface of the substrate 50, leaving the tunnel insulation film 60 between the floating gates 62 and the substrate 50. Each of the floating gates 62 is wider than the width of the active region 59 of the substrate 50 between the trenches. The isotropic etching of the device isolation films 58 at least partially exposes sidewalls of the floating gates 62.

When the sidewalls of the floating gates 62 are completely exposed by etching of the device isolation film 58, the tunnel insulation film 60 between the floating gates 62 and the substrate 50 may be partially removed. Such partial removal of the tunnel insulation film 60 may degrade the uniformity of the operational characteristics of a cell array in the memory device that includes such structures. Partial removal of the tunnel insulation film 60 may be avoided by only partially exposing the sidewalls of the floating gates 62 when etching the device isolation film 58. However, only partially exposing the sidewalls of the floating gates 62 may not provide an adequate capacitive coupling between the floating gates 62 and a subsequently formed control gate pattern 66.

Referring to FIG. 4, the inter-gate dielectric film 64 is conformably formed over the entire exposed upper surface of the structure of FIG. 3. The control gate film 66 is deposited on the inter-gate dielectric film 64. As shown in FIG. 4, opposite edge portions of a lower surface of the floating gates 62 are directly on the inter-gate dielectric film 64, and the control gate film 66 extends within an undercut region 70 below the opposite edge portions of the floating gates 62. The control gate film 66 within the undercut region 70 may form an undesirable conductive bridge between some of the floating gates 62.

SUMMARY OF THE INVENTION

Some embodiments of the present invention provide a nonvolatile memory device. Trenches are formed in a semiconductor substrate that define active regions therebetween. A device isolation film is in the trenches in the substrate. A tunnel insulation film is on the active regions of the substrate. A plurality of floating gates are each on the tunnel insulation film over the active regions of the substrate. An inter-gate dielectric film extends across the floating gates and the device isolation film. A control gate pattern is on the inter-gate dielectric film and extends across the floating gates. A recessed region of the device isolation film in the trenches has an upper major surface that is recessed below an upper major surface of a surrounding region of the device isolation film in the trenches. An edge of the recessed region of the device isolation film is aligned with a sidewall of an adjacent one of the floating gates.

Some other embodiments of the present invention provide a method of fabricating a nonvolatile memory device. Trenches are formed in a semiconductor substrate that define active regions therebetween. A device isolation film is formed that fills the trenches in the substrate. A tunnel insulating film is formed on the active regions of the substrate. A plurality of floating gates are formed with each of the floating gates on the tunnel insulating film over the active regions of the substrate. A portion of the device isolation film is removed over the trenches in the substrate to expose sidewalls of the floating gates. A recessed region of the device isolation film in the trenches is recessed so that the recessed region has an upper major surface that is recessed below an upper major surface of a surrounding region of the device isolation film in the trenches and an edge of the recessed region of the device isolation film is aligned with a sidewall of an adjacent one of the floating gates. An inter-gate dielectric film is formed that extends across the floating gates and the device isolation film. A control gate conductive film is formed on the inter-gate dielectric film and extending across the floating gates.

Some other embodiments of the present invention provide a method of fabricating a nonvolatile memory device. Trenches are formed in a semiconductor substrate that define active regions therebetween. A device isolation film is formed that fills the trenches in the substrate. A tunnel insulating film is formed on the active regions of the substrate. A plurality of floating gates are formed with each of floating gates on the tunnel insulating film over the active regions of the substrate. A portion of the device isolation film between the floating gates is isotropically etched to partially expose sidewalls of the floating gates. Another portion of the device isolation film between the floating gates is anisotropically etched to completely expose the sidewalls of the floating gates. An inter-gate dielectric film is formed that extends across the floating gates and the device isolation film. A control gate conductive film is formed on the inter-gate dielectric film and extending across the floating gates.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF EMBODIMENTS OF THE INVENTION

Figure 1:
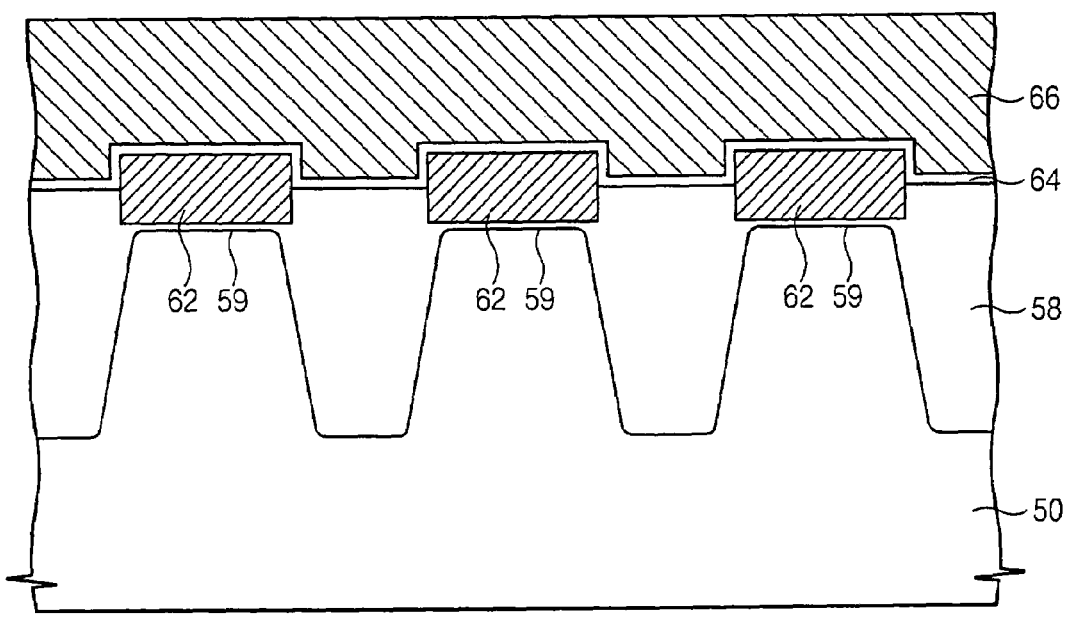
FIG. 1 is a cross sectional view of a conventional nonvolatile memory device.
Figure 2:
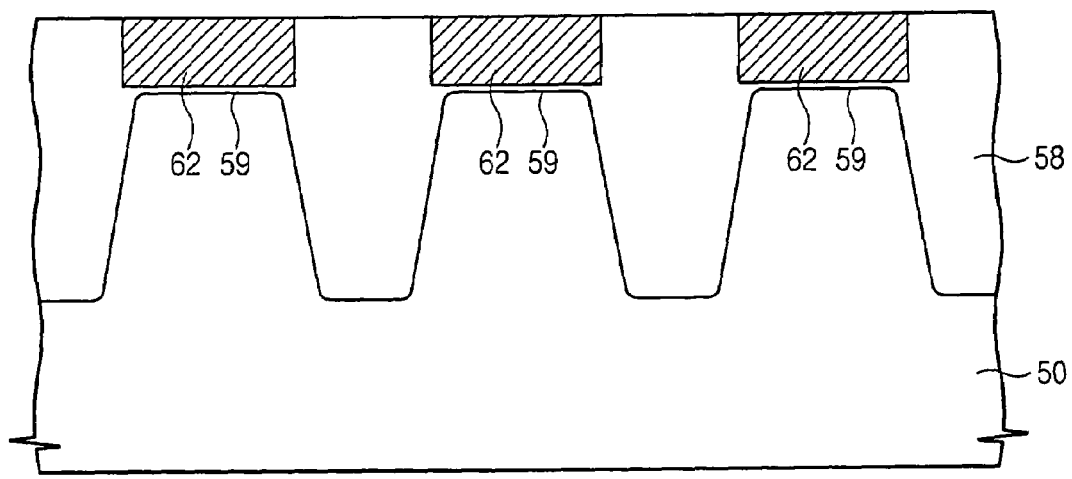
FIGS. 2, 3, and 4 are cross sectional views of conventional nonvolatile memory devices and illustrate methods of fabricating the same.
Figure 3:
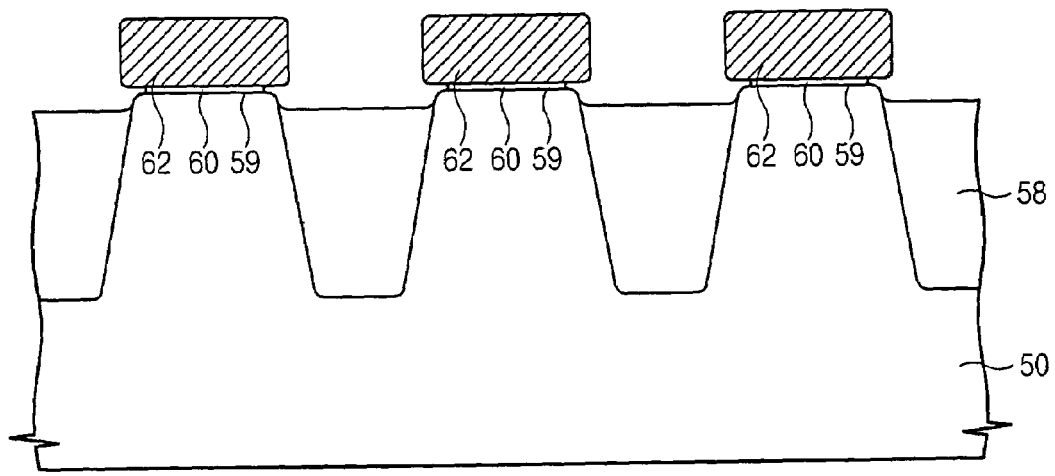
Figure 4:
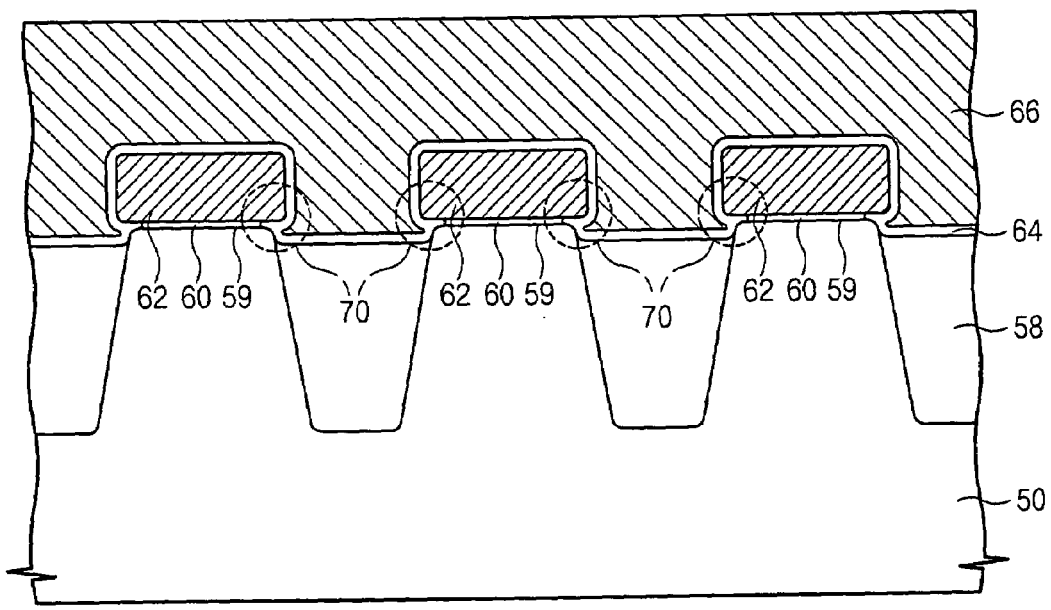

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
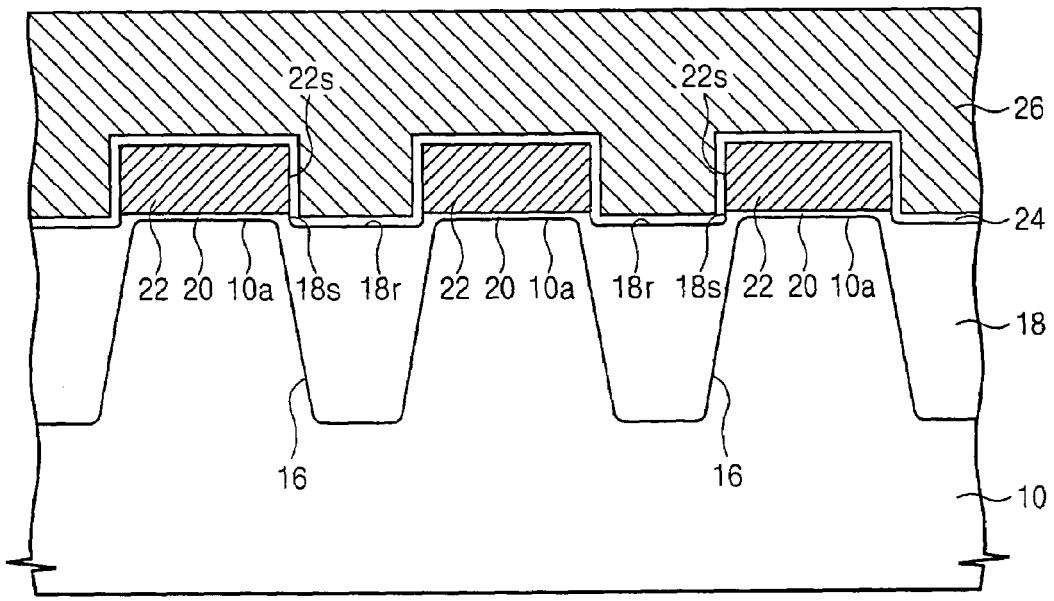
FIGS. 5 through 10 are cross sectional views of nonvolatile memory devices and illustrate methods of fabricating the same in accordance with various embodiments of the present invention.

FIG. 5 is a cross sectional view of a nonvolatile memory device and illustrates methods of fabricating the same in accordance with some embodiments of the present invention.

Referring to FIG. 5, the nonvolatile memory device includes a substrate 10 with trenches 16 that define active regions 10a between the trenches 16. A device isolation film 18 is in the trenches 16 of the substrate 10. A tunnel insulating film 20 is on the active regions 10a of the substrate 10. A plurality of floating gates 22 each are on the tunnel insulating film 20 over the active regions 10a of the substrate 10. The floating gates 22 are each wider than the active regions 10a so that sidewalls 22s of the floating gates 22 extend over a portion of the device isolation film 18 in the trenches 16. An inter-gate dielectric film 24 extends across the floating gates 22 and the device isolation film 18. A control gate pattern 26 is on the inter-gate dielectric film 24 and extends across the floating gates 22.

In accordance with some embodiments, a central region 18r of the device isolation film 18 has an upper major surface that is recessed below an upper major surface of a surrounding region of the device isolation film 18 in the trenches 16, and an edge 18s of the recessed central region 18r of the device isolation film 18 is aligned with a sidewall 22s of an adjacent one of the floating gates 22. The upper major surface of the recessed central region 18r may be below an upper major surface of the active regions 10a of the substrate 10.

Because the floating gates 22 are wider than the active regions 10a, the edge 18s of the recessed central region 18r is aligned with the sidewall 22s of the floating gates 22 but is electrically isolated from the edge of the active region 10a by the device isolation film 18. Accordingly, the device isolation film 18 can be immediately between the inter-gate dielectric film 24 and edge portions of the active regions 10a. Consequently, the thickness of the device isolation film 18 along the edge of the active regions 10a between the control gate film 26 and the active regions 10a may be adjusted to be sufficiently thick to provide a desired threshold for the associated transistor. The thickness of the device isolation film 18 can be adjustable by adjusting the width of the floating gates 22 relative to the width of the active regions 10a and/or by adjusting the depth of the upper major surface of the recessed central regions 18r of the device isolation film 18 relative to the upper major surface of the surrounding device isolation film 18.

The upper major surface of the recessed central region 18r of the device isolation film 18 may be aligned with or below the lower surface of the floating gates 22 so that the inter-gate dielectric film 24 completely covers the sidewalls 22s of the floating gates 22. Accordingly, the floating gates 22 can be wider than the active regions 10a and the device isolation film 18 can be completely removed from the sidewalls 22s of the floating gates 22. The inter-gate dielectric film 24 may therefore be directly between the control gate film 26 and the upper surface and side surfaces 22s of the floating gates 22, which can increase the capacitive coupling therebetween.

FIGS. 6 through 10 are cross sectional views of a nonvolatile memory device that illustrate methods of fabricating the same in accordance with some embodiments of the present invention.

Figure 6:
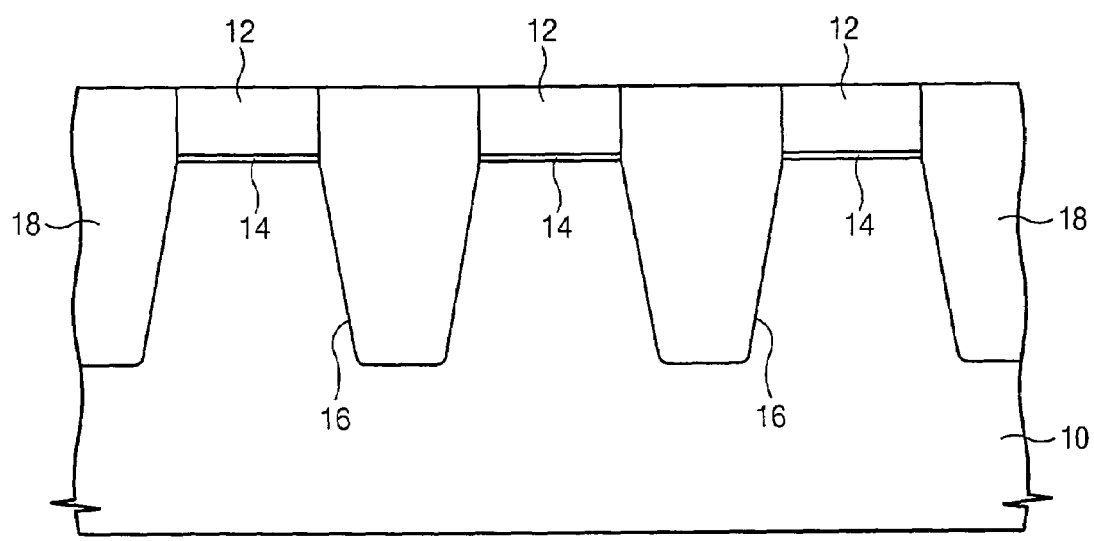

Referring to FIG. 6, a hard mask pattern 14 is formed on the semiconductor substrate 10. The trenches 16 are etched into the substrate 10 using the hard mask pattern 14 as an etch mask. The hard mask pattern 14 may be formed from a silicon-nitride film or a stacked silicon-nitride and silicon-oxide film. Before forming the silicon-nitride film on the substrate, a buffer oxide film 12 may be formed to reduce stress on the substrate 10. The trenches 16 are filled with an insulation film that also covers the substrate. The hard mask pattern 14 is exposed by polishing the insulation film by, for example, a chemical/mechanical polishing (CMP) process to form the device isolation film 18 in the trenches 16 between the hard mask patterns 14.

Figure 7:
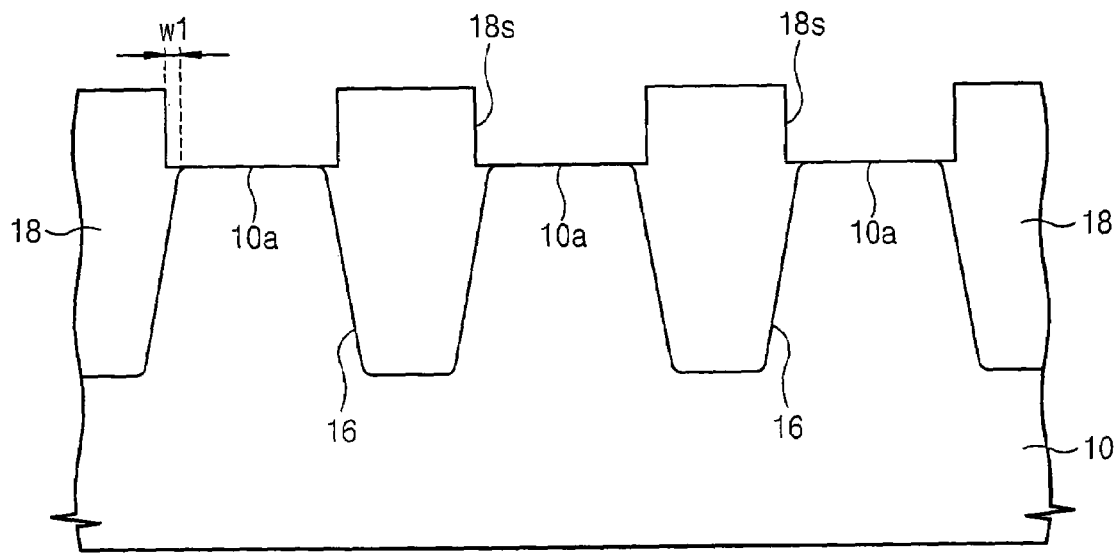

Referring to FIG. 7, the active region 10a confined by the device isolation film 18 is exposed by removing the hard mask pattern 14 and the buffer oxide film 12. The device isolation film 18 can be isotropically etched to recess sidewalls 18s of the exposed isolation film 18 by a recessed width w1. The device isolation film 18 thereby projects upward from the trenches 18 beyond the upper surface of the active regions 10a.

Figure 8:
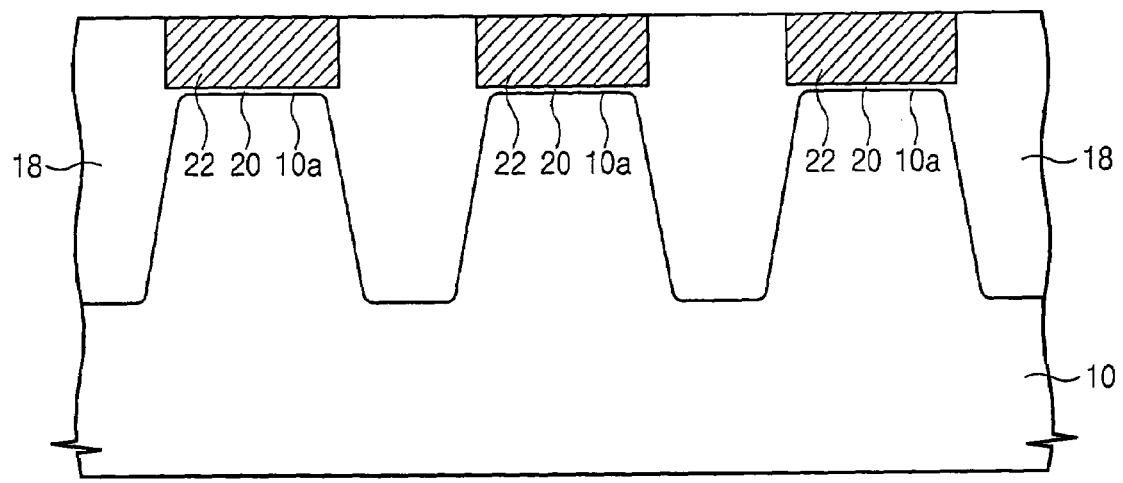

Referring to FIG. 8, a tunnel insulation film 20 is deposited on the active region 10a and a conductive film is deposited to fill the spaces between the projections of the device isolation film 18. The conductive film is polished by, for example, a CMP process to expose the device isolation film 18 and form floating gates 22 over the active regions 10a in the regions between the device isolation film 18. Because sidewalls of the device isolation film 18 have been recessed by a width w1, the width of the floating gates 22 is wider than the width of the active regions 10a. The floating gates 22 can thereby have a larger surface area compared to if they were only as wide as the active regions 10. The edges of the floating gates 22 extend over a portion of the trenches 16 and overlap a portion of the device isolation film 18.

Figure 9:
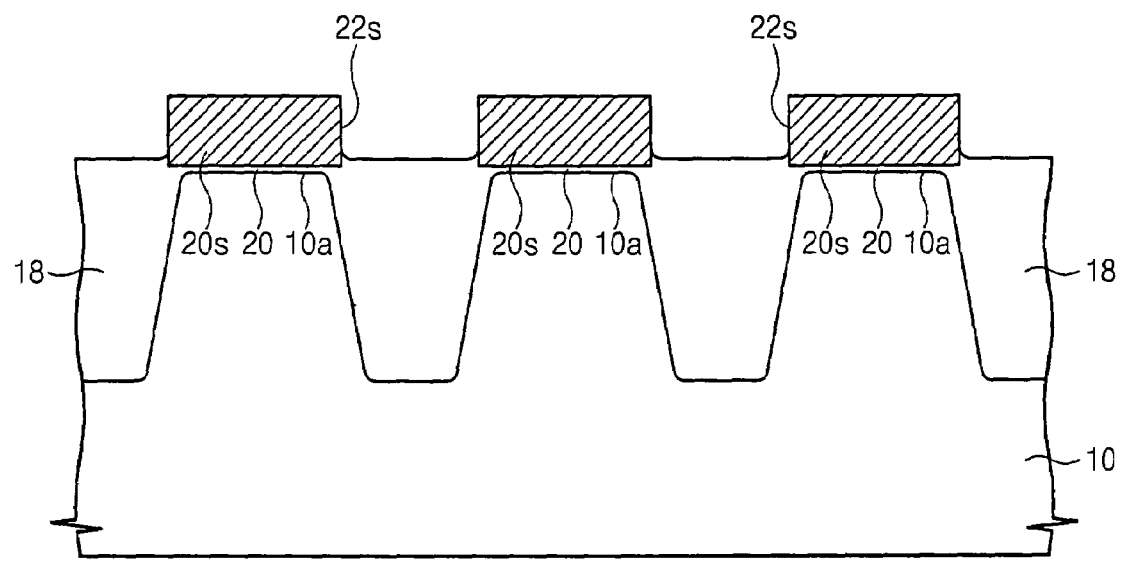

Referring to FIG. 9, the device isolation film 18 is recessed to partially expose sidewalls of the floating gates 22. The device isolation film 18 can be isotropically etched to recess it. By isotropically etching the device isolation film 18 instead of anisotropic dry etching the device isolation film 18, damage to the floating gates 22 from ion contamination may be avoided. The tunnel insulation film 20 between the floating gates 22 and the active regions 10a should not be exposed when the device isolation film 18 is recessed by the above isotropical etching process.

Figure 10:
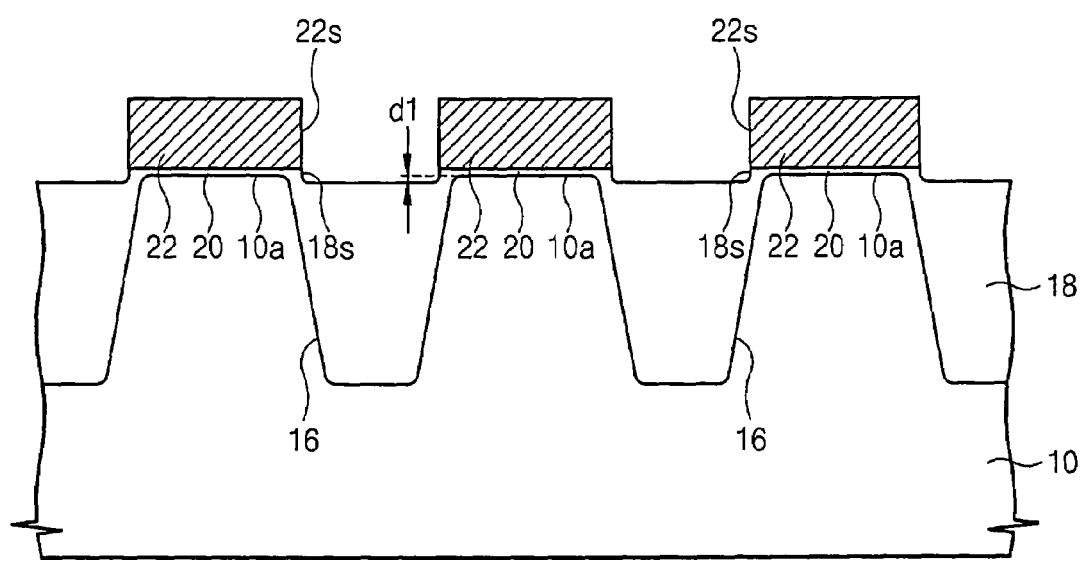

Referring to FIG. 10, the central region 18r (FIG. 5) of the device isolation film 18 in the trenches 16 is then further recessed by an anisotropic etching process that completely exposes the sidewalls 22s of the floating gates 22. The edge 18s of the upper major surface of the recessed central region 18r of the device isolation film 18 is aligned with the sidewalls 22s of the floating gates 22. The edges 18s of the floating gates 22 thereby overlap a portion of the device isolation film 18, so that a portion of the device isolation film 18 is below the edges 18s of the floating gates 22 after the upper major surface of the central region 18r of the device isolation film 18 is recessed below the bottom surface of the floating gates 22. Accordingly, the edge 18s of the upper major surface of the recessed central region 18r of the device isolation film 18 is separated from the edge of the active region 10a based on the difference between the widths of the floating gates 22 and the active regions 10a. The upper surface of the recessed central region 18r of the device isolation film 18 may be recessed below the upper major surface of the active regions 10a by a defined depth. Because the central region 18r of the device isolation film 18 is recessed through an anisotropic etching process, damage to the tunnel oxide film 20 between the floating gates 22 and active regions 10a can be avoided. Moreover, when a wet cleaning process is carried out after the anisotropic etching process, the tunnel insulation film 20 can be protected from damage by the device isolation film 18 that remains below the edge surfaces 22s of the floating gates 22.

The inter-gate dielectric film 24 is conformably formed on the resultant structure. The control gate film 26 is formed on the inter-gate dielectric film 24 extending across the floating gates 22, illustrated by the exemplary structure shown in FIG. 5.

Subsequent processing is then carried out to complete the structure of the nonvolatile memory device by well-known semiconductor fabrication techniques. For instance, the control gate film 26 and inter-gate dielectric film 24 are patterned to form control gate electrodes. A floating gate electrode can be formed by forming the floating gates 22 so they are aligned with and under the control gate electrode. The portion of the tunnel insulation film 20, which is exposed on the substrate 10 after partially removing the floating gates 22, may be removed by a wet cleaning process or may be used as a buffer layer when subsequently forming an impurity diffusion layer in the substrate 10.

As discussed above with regard to some embodiments of the present invention, the device isolation film 18 can be initially recessed by an isotropic etching process to expose portions of the sidewalls 22s of the floating gates 22, and a central region 18r can then be recessed below a surrounding region of the device isolation film 18 by an anisotropic etching process. When isotropically etching the device isolation film 18 to expose portions of the sidewalls 22s of the floating gates 22 it can be important to not expose the tunnel insulation film 20 between the floating gates 22 and the active regions 10a so that it is not damaged by the etching. The sidewalls 22s of the floating gates 22 are then completely exposed by anisotropically etching the device isolation film 18 to recess the central region 18r thereof. The amount of overlap of the edges portions of the floating gates 22 and the device isolation film 18 in the trenches 18 can be adjusted by adjusting the amount of time and/or etching rate of the wet isotropic etching process carried out on the device isolation film 18.

Accordingly, edges of the recessed central region of the device isolation film 18 can be aligned with edges of the floating gates 22 by etching the device isolation film 18 using a sequence of isotropical etching followed by anisotropical etching of the device isolation film 18. Therefore, a surface area of the floating gates 22 may be enlarged while avoiding damage to the tunnel insulation film 20 between the floating gates 22 and the active regions 10a of the substrate 10. Avoiding damage to the tunnel insulation film 20 may improve the uniformity of the characteristics of the memory cells formed thereby in the memory device, and increasing the surface area of the floating gates relative to the active regions of the substrate may increase the coupling between the control gate and the floating gates of the memory cells.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. A method of fabricating a nonvolatile memory device, the method comprising:
   forming trenches in a semiconductor substrate that define active regions therebetween;
   forming a device isolation film that fills the trenches in the substrate;
   forming a tunnel insulating film on the active regions of the substrate;
   forming a plurality of floating gates each on the tunnel insulating film over the active regions of the substrate;
   removing a portion of the device isolation film over the trenches in the substrate to expose sidewalls of the floating gates;
   recessing a region of the device isolation film in the trenches so that the recessed region has an upper major surface that is recessed below an upper major surface of a surrounding region of the device isolation film in the trenches and so that an edge of the recessed region is aligned with a sidewall of an adjacent gate, wherein the floating gate is formed wider than the active region of the substrate and an edge portion of the floating gate partially overlaps a portion of the device isolation film in the trench;
   forming an inter-gate dielectric film extending across the floating gates and the device isolation film; and
   forming a control gate conductive film on the inter-gate dielectric film and extending across the floating gates.

2. The method of claim 1, wherein recessing a region of the device isolation film in the trenches comprises recessing the region of the device isolation film so that opposite edges of the recessed region of the device isolation film are aligned with facing sidewalls of adjacent ones of the floating gates.

3. The method of claim 1, wherein the upper major surface of the recessed region of the device isolation film is below an upper major surface of the active region of the substrate.

4. The method of claim 1, wherein opposite edge portions of a lower surface of the floating gates are formed directly on the device isolation film.

5. The method of claim 1, wherein the inter-gate dielectric film is formed directly on at least one entire side surface of each of the floating gates.

6. The method of claim 1, wherein the inter-gate dielectric film is formed directly on at least two opposite entire side surfaces of each of the floating gates.

7. A method of fabricating a nonvolatile memory device, the method comprising:
   forming trenches in a semiconductor substrate that define active regions therebetween;
   forming a device isolation film that fills the trenches in the substrate;
   forming a tunnel insulating film on the active regions of the substrate;
   forming a plurality of floating gates each on the tunnel insulating film over the active regions of the substrate;
   isotropically etching a portion of the device isolation film between the floating gates to partially expose sidewalls of the floating gates;
   anisotropically etching another portion of the device isolation film between the floating gates to completely expose the sidewalls of the floating gates;
   forming an inter-gate dielectric film extending across the floating gates and the device isolation film; and
   forming a control gate conductive film on the inter-gate dielectric film and extending across the floating gates.

8. The method as of claim 7, wherein:
   forming trenches in a semiconductor substrate comprises:
   forming a hard mask pattern on the semiconductor substrate; and
   etching the substrate with the hard mask pattern as an etch mask to form the trenches;
   forming a tunnel insulating film comprises:
   removing the hard mask pattern to expose the active regions of the substrate; and
   forming the tunnel insulation film on the substrate exposed by removing the hard mask pattern; and forming a plurality of floating gates comprises:
forming a conductive film on the device isolation film and the tunnel insulating film; and
polishing the conductive film until the device isolation film is exposed.

9. The method of claim 8, wherein forming a plurality of floating gates further comprises removing a portion of the device isolation film to form an opening that extends across the active regions of the substrate and overlaps a portion of the trenches, and the conductive film is formed in the opening.

10. The method of claim 8, wherein forming a plurality of floating gates comprises forming each of the floating gates wider than an adjacent active region of the substrate and so that edge portions of each floating gate extend over a portion of the device isolation film in the trenches.

11. The method of claim 8, wherein isotropically etching a portion of the device isolation film between the floating gates to partially expose sidewalls of the floating gates comprises stopping the isotropic etching of the device isolation film before the tunnel insulation film is exposed.

12. The method of claim 8, wherein anisotropically etching another portion of the device isolation film between the floating gates to completely expose the sidewalls of the floating gates comprises etching the device isolation film with the floating gates as an etch mask.

13. The method of claim 12, wherein etching the device isolation film with the floating gates as an etch mask comprises recessing a region of the device isolation film in the trenches so that the recessed region has an upper major surface that is recessed below an upper major surface of a surrounding region of the device isolation film in the trenches and an edge of the recessed region of the device isolation film is aligned with a sidewall of an adjacent one of the floating gates.

14. The method of claim 13, wherein the upper major surface of the recessed region of the device isolation film is below a lower surface of the floating gates.

15. The method of claim 13, wherein the inter-gate dielectric film is formed on the device isolation film including the recessed region and is separated from the active regions of the substrate by the device isolation film.

* * * * *